United States Patent
Kuo

(10) Patent No.: US 9,229,495 B2
(45) Date of Patent: Jan. 5, 2016

(54) SUPPORT-RETAINING STRUCTURE FOR INTERFACE CARD

(71) Applicants: LITE-ON ELECTRONICS (GUANGZHOU) LIMITED, Guangzhou (CN); LITE-ON TECHNOLOGY CORPORATION, Taipei (TW)

(72) Inventor: Yu-Ching Kuo, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 227 days.

(21) Appl. No.: 14/013,439

(22) Filed: Aug. 29, 2013

(65) Prior Publication Data
US 2014/0293567 A1    Oct. 2, 2014

(30) Foreign Application Priority Data

Mar. 27, 2013  (CN) .......................... 2013 1 0103601

(51) Int. Cl.
| | |
|---|---|
| G06F 1/16 | (2006.01) |
| G06F 1/18 | (2006.01) |
| H05K 7/14 | (2006.01) |
| H05K 9/00 | (2006.01) |
| G06F 1/20 | (2006.01) |
| H05K 5/00 | (2006.01) |
| H05K 7/00 | (2006.01) |

(52) U.S. Cl.
CPC .............. *G06F 1/186* (2013.01); *G06F 1/1658* (2013.01); *G06F 1/185* (2013.01); *G06F 1/187* (2013.01); *G06F 1/188* (2013.01); *H05K 7/1401* (2013.01); *H05K 7/1404* (2013.01); *H05K 7/1408* (2013.01); *H05K 7/1409* (2013.01); *H05K 9/0035* (2013.01)

(58) Field of Classification Search
CPC ......... G06F 1/187; G06F 1/185; G06F 1/186; G06F 1/188; G06F 1/1658; H05K 7/1401; H05K 7/1404; H05K 7/1408; H05K 7/1409; H05K 9/0035
USPC ............. 361/679.31, 679.32, 679.33, 679.37, 361/679.38, 679.39, 679.57, 679.58, 725, 361/730, 731, 732, 733, 740, 747, 759, 801, 361/802; 248/224.8
See application file for complete search history.

(56) References Cited

U.S. PATENT DOCUMENTS

| | | | |
|---|---|---|---|
| 6,471,170 B2 * | 10/2002 | Pook .............................. | 248/215 |
| 2008/0130245 A1 * | 6/2008 | Chen et al. .................... | 361/726 |

* cited by examiner

*Primary Examiner* — Hoa C Nguyen
*Assistant Examiner* — Binh Tran
(74) *Attorney, Agent, or Firm* — Li & Cai Intellectual Property (USA) Office

(57) ABSTRACT

A support retaining structure for interface card includes a support frame, a hook and positioning structure, an active hook, and a fixing member, wherein the support frame, the hook and positioning structure, the active hook, and the fixing member are cooperated to each other in order to make the support and fixing structure be suitable for interface card with different dimensions, and the hook and positioning structure is able to easily disassembly from the support frame and assembly to the support frame.

9 Claims, 17 Drawing Sheets

SUPPORT-RETAINING STRUCTURE FOR INTERFACE CARD

BACKGROUND OF THE INVENTION

1. Field of the Invention

The present disclosure relates to a support-retaining structure for interface card; in particular, to a support-retaining structure applicable for interface cards of different dimensions and able to be easily disassembled and assembled.

2. Description of Related Art

A computer has expansion slots for connecting with different types of interface cards. The expansion slots are disposed on the motherboard in the main casing and have many different specifications.

Referring to FIG. 13, a conventional interface card and its retaining structure fix an interface card 6 inside the main casing 7 by using screws. The main casing 7 has a motherboard. The motherboard has a plurality of expansion slots 71, each of which can engage with an interface card 6. Each of the interface cards 6 has a protruding plate 60 with a circuit board on the inner face of the protruding plate 60 and a connector connected to the circuit board on the outer face of the same for connecting with external devices. Additionally, one end of the protruding plate 60 is bent to form a fixing portion 62. The fixing portion 62 is formed with a through hole.

An interlocking base 8 is disposed in the main casing 7 at a position corresponding to the expansion slots 71, a plurality of openings 81 corresponding to the expansion slots 71 is disposed on the interlocking base 8, and a screw hole 82 is disposed next to each of the opening 81, so that when an interface card 6 is engaged in an expansion slot 71, the protruding plate 60 abuts the opening 81 such that the fixing portions 62 align with an end of the interlocking base 8, and a screw 83 passes through the through hole of the fixing portion 62 to lock to the screw hole 82 such that the interface card 6 is fixed to the main casing 7.

Conventional interface cards are fixed on the circuit board, unable to be changed or modified. When changing different expansion functions, entire interface cards need to be changed, which is not environmentally friendly. As the function of the interface cards becomes more powerful, such as a multimedia circuit card, the thickness and length of the cards have to be constantly changed, and additionally, heat sinks and fans are installed, which increases considerable weight.

SUMMARY OF THE INVENTION

The object of the present disclosure is to provide a support-retaining structure for interface card which has an adjustable fixing structure for accommodating multimedia circuit cards of different dimensions and is easy to disassemble and assemble.

A support-retaining structure for interface card includes a support frame, a hook-positioning structure, a movable hook, and a fixing member. The support frame includes a support-frame bottom portion, a front support structure, and a side support structure. The support-frame bottom portion has the shape of a flat plane and includes a first support-frame edge, a second support-frame edge, a third support-frame edge, a fourth support-frame edge and a fixing structure defining a plurality of retaining positions. The first support-frame edge and the third support-frame edge are opposite edges. The second support-frame edge and the fourth support-frame edge are opposite edges. The fixing structure is disposed proximal to the fourth support-frame edge. The front support structure is arranged on a first surface of the support-frame bottom portion, stands upright on the first support-frame edge, and has at least one protruding plate for locking with a computer casing. The side support structure is arranged on the first surface of the support-frame bottom portion, stands upright on the second support-frame edge, and is formed with at least one through slot for the connector pin of the interface card to pass through.

The hook-positioning structure is a connected L-shaped structure including a horizontal portion and a vertical portion perpendicular to each other. The vertical portion is formed with a vertical-portion slot.

The movable hook is an L-shaped structure including a retaining portion and a fastening portion extending perpendicularly from the retaining portion. The retaining portion has first and second retaining faces. The fastening portion has a fastening hole selectively corresponding to different positions on the vertical-portion slot.

According to the dimensions of the interface card, the hook-positioning structure is retained at one of the retaining positions of the fixing structure, and at the same time the fixing member can fix the movable hook at a specific location on the vertical-portion slot by passing through the fastening hole of the movable hook and the vertical-portion slot.

In order to further the understanding regarding the present disclosure, the following embodiments are provided along with illustrations to facilitate the disclosure of the present disclosure.

DETAILED DESCRIPTION OF THE PREFERRED EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

Figure 1:
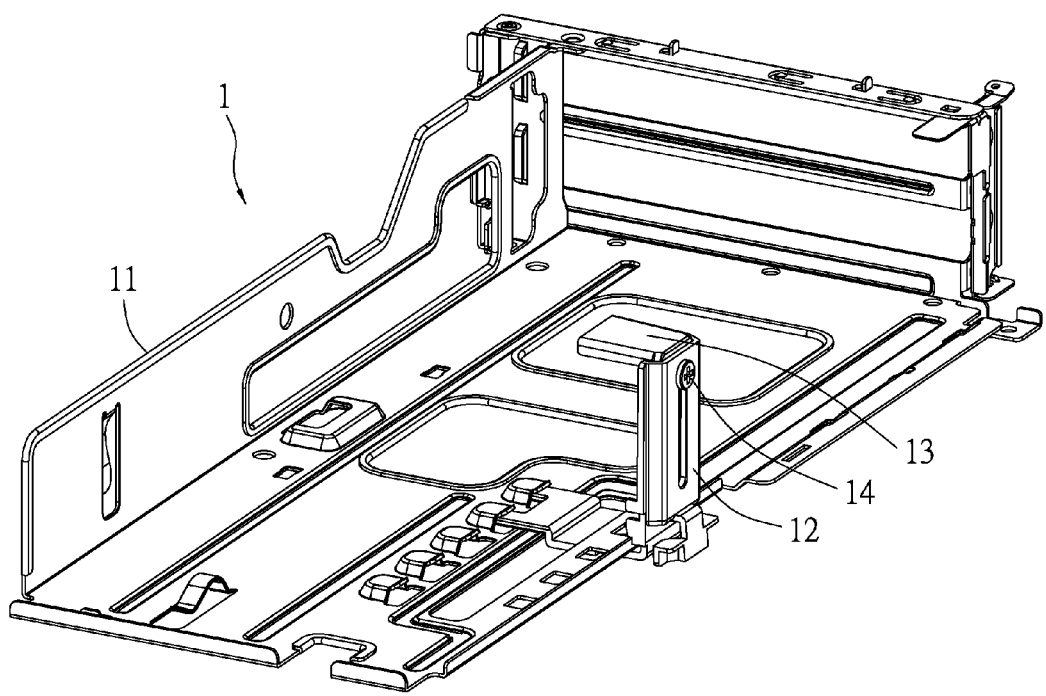
FIG. 1 is a schematic diagram of a support-retaining structure for interface card according to a preferred embodiment of the present disclosure.

FIG. 1 is a schematic diagram of a support-retaining structure for interface card according to a preferred embodiment of the present disclosure. The present disclosure provides a support-retaining structure 1 for interface card, which includes a support frame 11, a hook-positioning structure 12 disposed on the support frame 11, a movable hook 13 disposed at one end of the hook-positioning structure 12, and a fixing member 14 for fixing the movable hook 13 on the hook-positioning structure 12. The interface card of the present embodiment refer to a circuit board for expansion functions of a computer, such as a multimedia circuit card, network card, etc.; but the present disclosure is not limited hereto.

Figure 2:
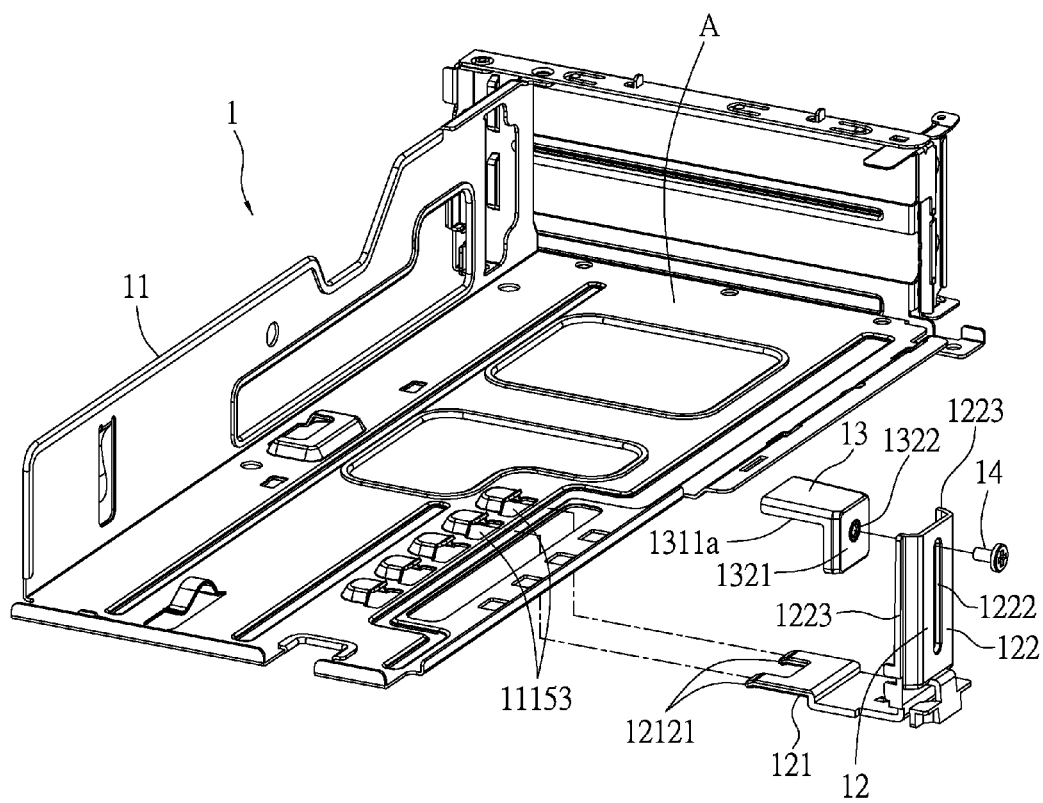
FIG. 2 is an exploded schematic diagram of the support-retaining structure for interface card according to a preferred embodiment of the present disclosure.

FIG. 2 is an exploded schematic diagram of the support-retaining structure for interface card according to a preferred embodiment of the present disclosure. The hook-positioning structure 12 of the present embodiment is an L-shaped structure whose bottom portion has a free end removably fastened to different positions on the support frame 11, such that interface cards of different lengths can be clamped between the support frame 11 and the hook-positioning structure 12. The movable hook 13 is also an L-shaped structure, adjustably fastened by the fixing member 14 at different vertical positions on the hook-positioning structure 12, such that interface cards of different thicknesses can be clamped between the support frame 11 and the movable hook 13. Other elements of the present disclosure are described in more detail below.

Figure 3:
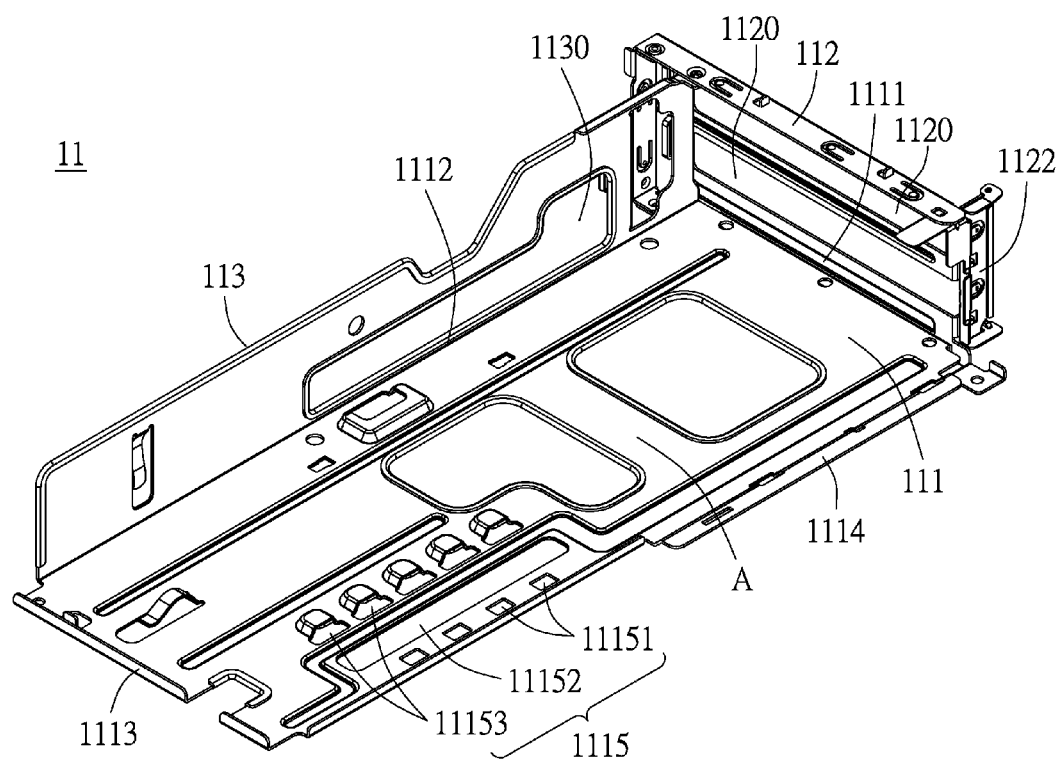
FIG. 3 is a schematic diagram of a support frame of the support-retaining structure for interface card according to the present disclosure.

FIG. 3 is a schematic diagram of a support frame of a support-retaining structure for interface card according to the present disclosure. The support frame 11 of the present embodiment includes a support-frame bottom portion 111, a front support structure 112, and a side support structure 113.

The support-frame bottom portion 111 has the shape of a flat plane and includes a first support-frame edge 1111, a second support-frame edge 1112, a third support-frame edge 1113, a fourth support-frame edge 1114 and a fixing structure 1115. The first support-frame edge 1111 and the third support-frame edge 1113 are opposite edges. In the present embodiment, the first support-frame edge 1111 and the third support-frame edge 1113 are arranged at the front and rear of the support frame 11 in the longitudinal direction. The second support-frame edge 1112 and the fourth support-frame edge 1114 are opposite edges. In the present embodiment, the second support-frame edge 1112 and the fourth support-frame edge 1114 are arranged along the two sides of the longitudinal direction. The fixing structure 1115 is proximal to the fourth support-frame edge 1114, and relatively close to the third support-frame edge 1113. The fixing structure 1115 includes a fixing-structure opening 11152, a plurality of engagement holes 11153, and a plurality of abutting holes 11151. The fixing-structure opening 11152 is proximal and parallel to the fourth support-frame edge 1114. The plurality of engagement holes 11153 is arranged on the side of the fixing-structure opening 11152 opposite to the fourth support-frame edge 1114, and is parallel to the fourth support-frame edge 1114. The plurality of abutting holes 11151 is arranged parallel to the fourth support-frame edge 1114 between the fixing-structure opening 11152 and the fourth support-frame edge 1114.

Figure 7:
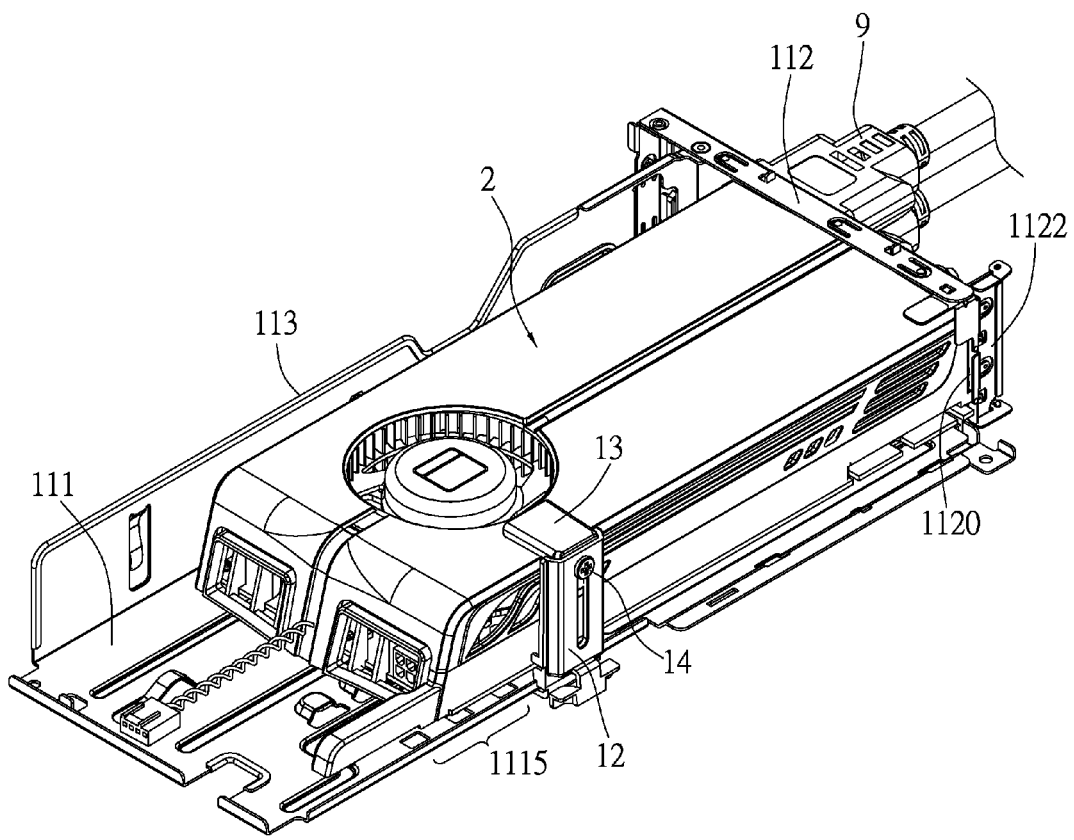
FIG. 7 is a diagram illustrating practical application of the support-retaining structure for interface card according to the present disclosure.

As shown in FIG. 3, the front support structure 112 is arranged on a first surface A of the support-frame bottom portion 111, and stands upright on the first support-frame edge 1111. The front support structure 112 has at least one interface port 1120 such that the interface card 2 can connect to an external connector 9 (refer to FIG. 7). Additionally, the front support structure 112 has at least one protruding plate 1122 for locking with the computer casing (not shown in the figures). The side support structure 113 is arranged on the first surface A of the support-frame bottom portion 111, and stands upright on the second support-frame edge 1112. The side support structure 113 has at least one through slot 1130 such that the connector pin (not shown in the figure) of the interface card (as shown in FIG. 7) can to pass through the through slot 1130.

Figure 4:
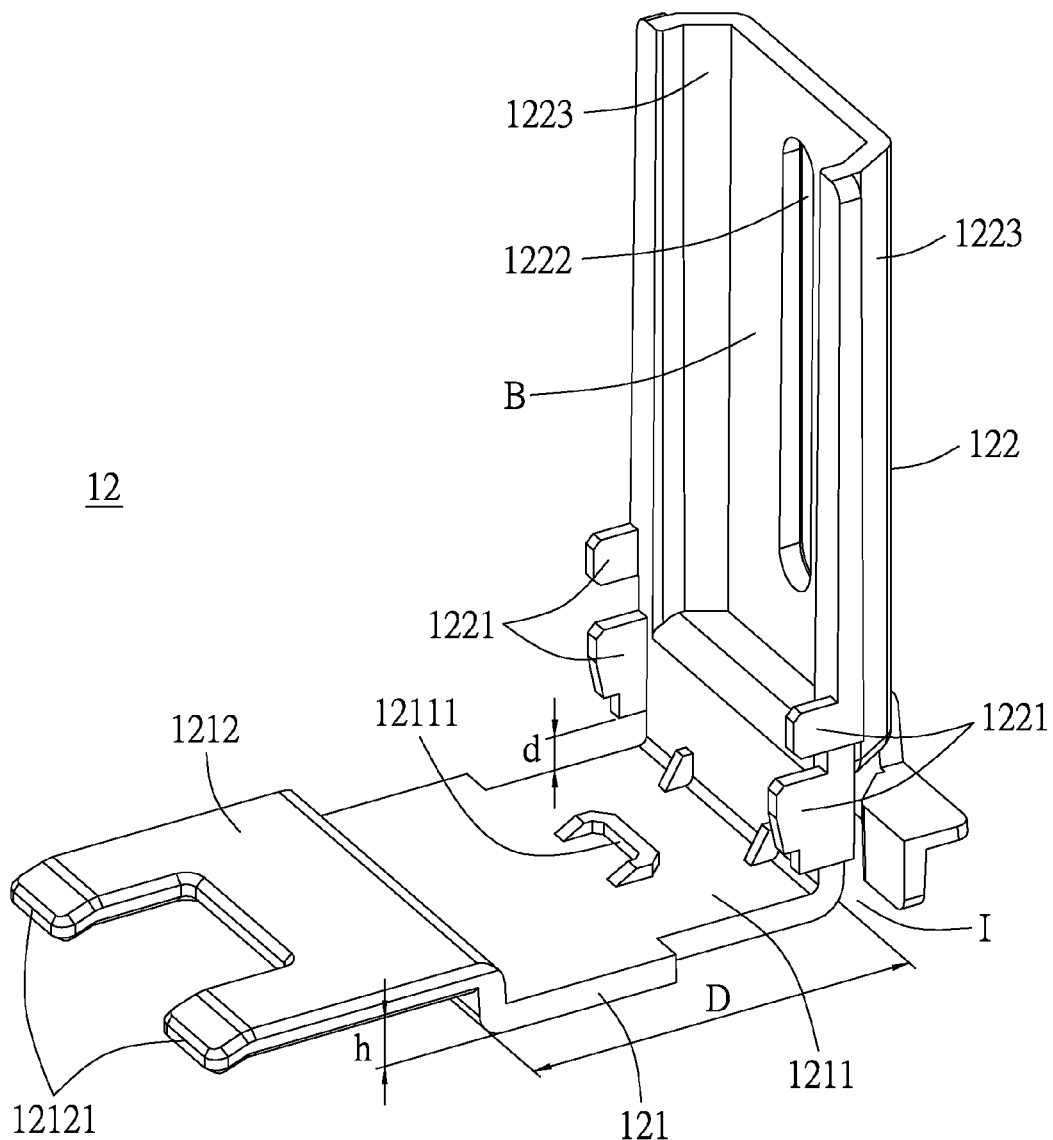
FIG. 4 is a schematic diagram of a hook-positioning structure of a support-retaining structure for interface card according to the preferred embodiment of the present disclosure.

FIG. 4 is a schematic diagram of a hook-positioning structure of the support-retaining structure for interface card according to a preferred embodiment of the present disclosure. The hook-positioning structure 12 is a connected L-shaped structure including a horizontal portion 121 and a vertical portion 122 substantially perpendicular to each other. The horizontal portion 121 includes an extension portion 1211 and a locking portion 1212. The extension portion 1211 is formed by extending a distance D outward from the intersection I of the horizontal portion 121 and the vertical portion 122, then extending a distance h in a direction parallel to the vertical portion 122, then the locking portion 1212 is formed by extending in a direction parallel to (the overall direction of) the extension portion 1211, and finally two curved engagement portions 12121 are formed at the free end of the locking portion 1212.

When the hook-positioning structure 12 is connected to the fourth support-frame edge 1114 of the support-frame bottom portion 111, the distance D of the extension portion 1211 of the horizontal portion 121 allows the horizontal portion 121 to cross the face opposite the first surface A; additionally, the distance h between the locking portion 1212 and the extension portion 1211 allows the locking portion 1212 to pass through the fixing-structure opening 11152 and lap on the first surface A, such that the curved engagement portions 12121 can engage the engagement holes 11153. Moreover, the extension portion 1211 has an abutting portion 12111 for engaging with one of the abutting holes 11151 when the extension portion 121 crosses the face opposite the first surface A.

Figure 12:
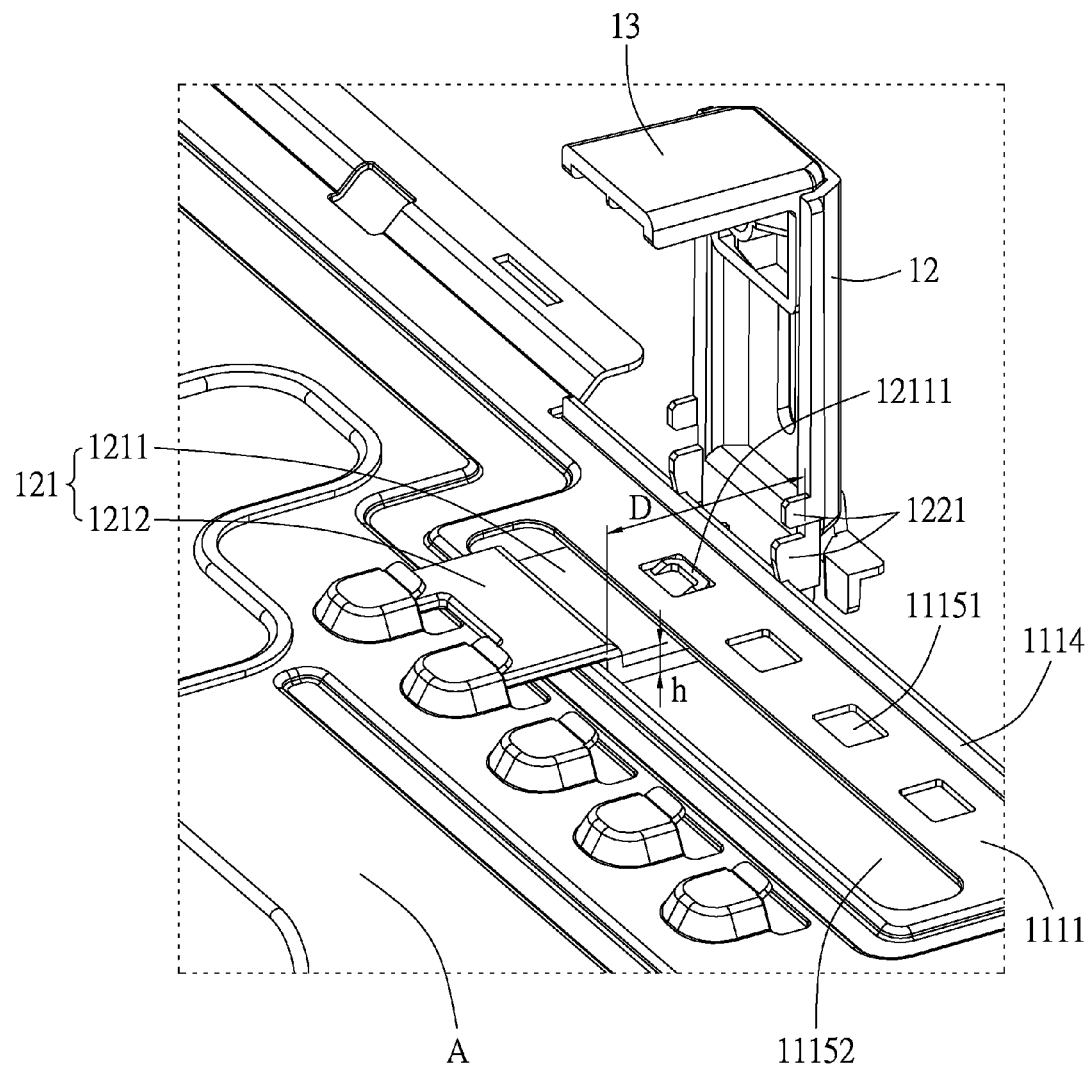
FIG. 12 is a detailed schematic structural diagram of a hook-positioning structure fastened to the support frame according to a preferred embodiment of a support-retaining structure for interface card of the present disclosure.
Figure 13:
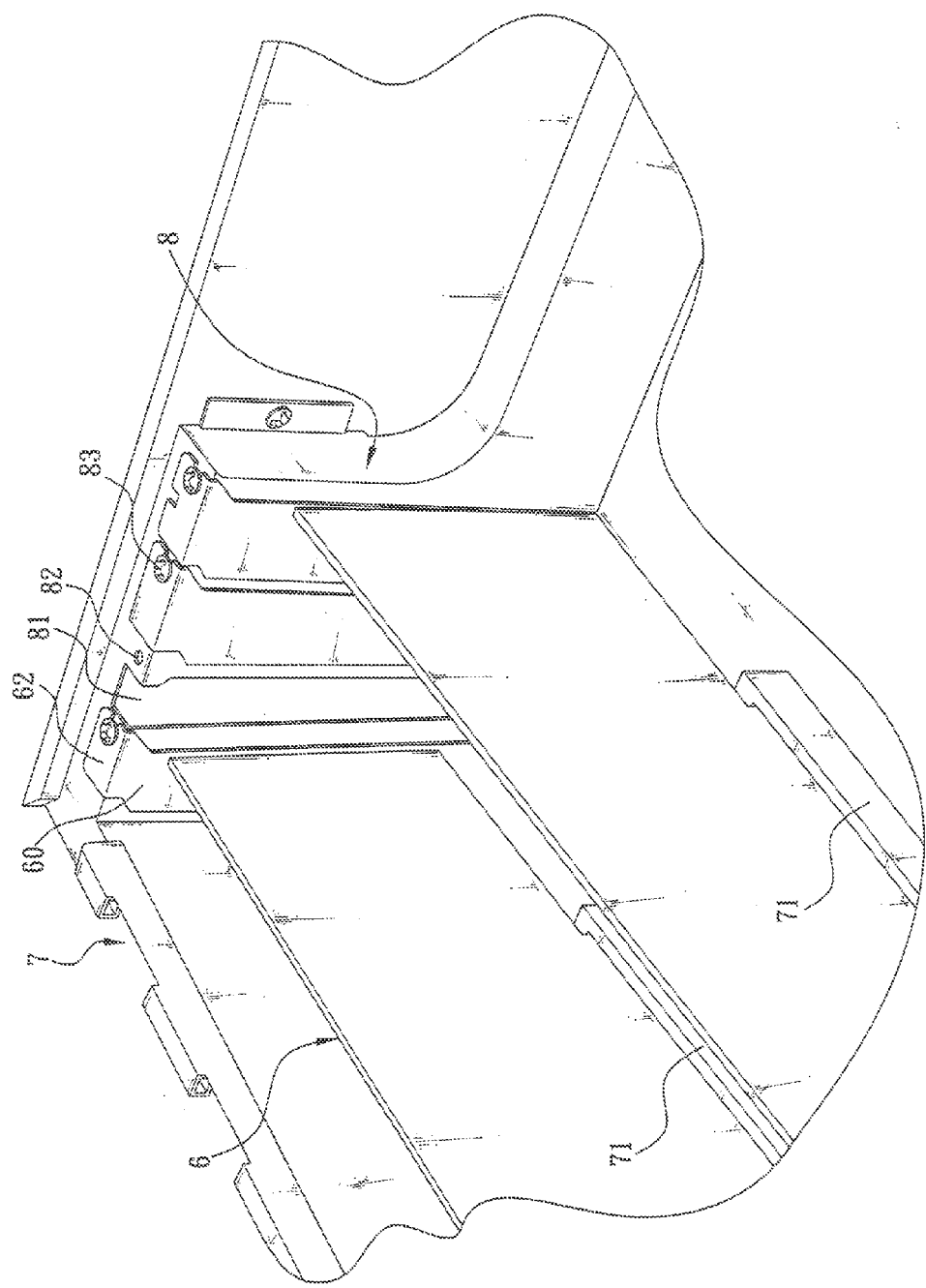
FIG. 13 is a schematic diagram of a conventional interface card and the corresponding fixing structure.

As shown in FIG. 2 and FIG. 12 the vertical portion 122 includes two fitting portions 1221, a vertical-portion slot 1222 and two reinforcement walls 1223. The two fitting portions 1221 are arranged at two sides of the vertical portion 122 and extend in a direction parallel to the horizontal portion 121. The bottom end of the two fitting portions 1221 is distance d away from the intersection I. The vertical portion 122 has an inner face B facing the horizontal portion 121. The vertical-portion slot 1222 is a long and narrow opening arranged in the center of the vertical portion 122. The two reinforcement walls 1223 are positioned at two sides of the vertical portion 122. When the hook-positioning structure 12 is connected to the fourth support-frame edge 1114, the distance d between the two fitting portions 1221 and the intersection d allows the two fitting portions 1221 to clasp the fourth support-frame edge 1114 of the first surface A.

Figure 5:
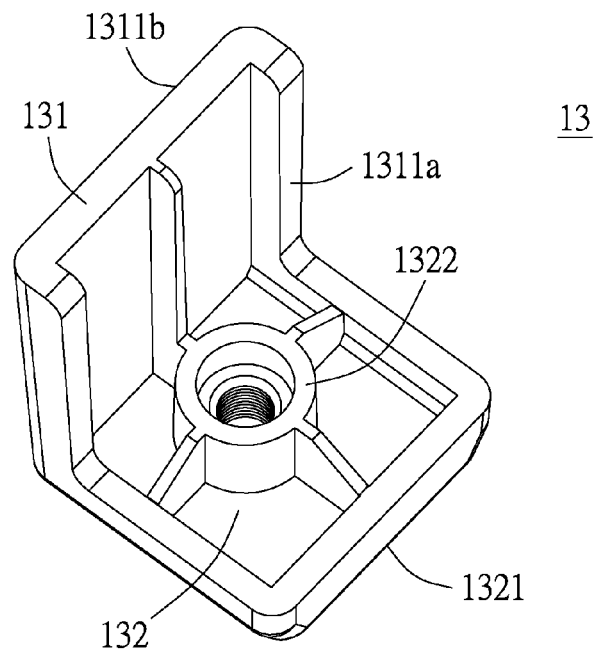
FIG. 5 is a schematic diagram of a movable hook of the support-retaining structure for interface card according to a preferred embodiment of the present disclosure.
Figure 9A:
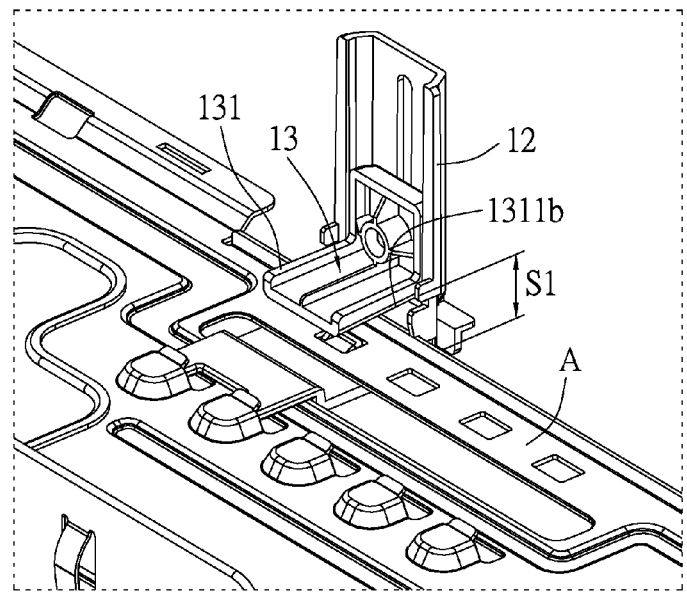
FIG. 9A to FIG. 9B are schematic diagrams of the support-retaining structure for interface card adjusted to retain interface cards of different thicknesses according to the present disclosure.
Figure 9B:
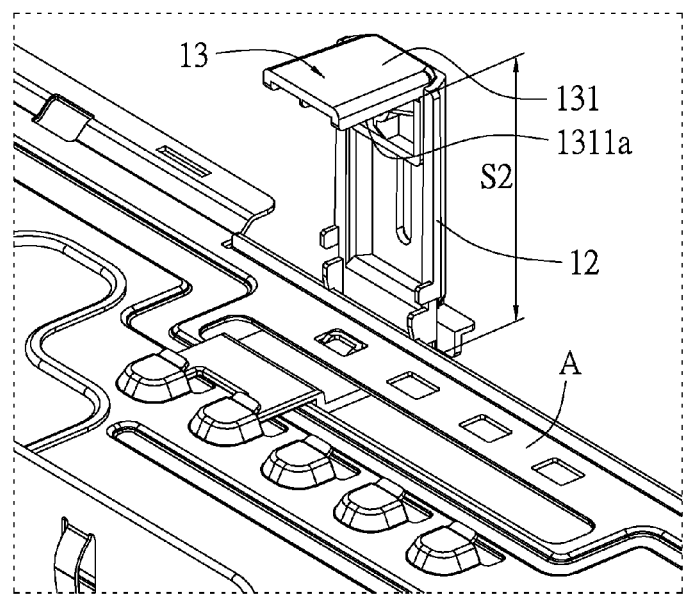

FIG. 5 is a schematic diagram of a movable hook of the support-retaining structure for interface card according to a preferred embodiment of the present disclosure. The movable hook 13 is an L-shaped structure including a retaining portion 131 and a fastening portion 132 extending perpendicularly from the retaining portion 131. The retaining portion 131 has a first retaining face 1311a and a second retaining face 1311b. The first retaining face 1311a is arranged at the inner side of the retaining portion 131 and faces the fastening portion 132. The second retaining face 1131b is arranged at the outer side of the retaining portion 131. The fastening portion 132 has a fastening-portion abutting face 1321 and a fastening hole 1322. The fastening-portion abutting face 1321 is arranged on the outer side of the fastening portion 132. The fastening hole 1322 is arranged at the center of the fastening portion 132. The fastening-portion abutting face 1321 of the movable hook 13 conformingly fits on the inner face B of the vertical portion 122 (as shown in FIG. 4), so that the fastening hole 1322 can selectively correspond to different positions of the vertical-portion slot 1222. At this moment, the first retaining face 1311a and the first surface A of the support-frame bottom portion 111 are two faces corresponding to each other as shown in FIG. 2 and FIG. 9B. Alternatively, the movable hook 13 can be flipped such that the second retaining face 1311b and the first surface A of the support-frame bottom portion 111 are two faces corresponding to each other as shown in FIG. 9A.

Figure 6:
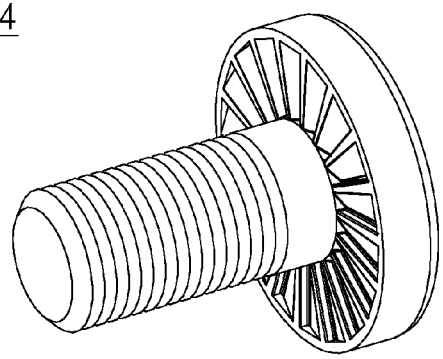
FIG. 6 is a schematic diagram of a screw of the support-retaining structure for interface card according to a preferred embodiment of the present disclosure.

When the fastening hole 1322 corresponds to the vertical-portion slot 1222, the fixing member 14 can simultaneously pass through the fastening hole 1322 and the vertical-portion slot 1222 for fastening. In the present preferred embodiment, as shown in FIG. 6, the fixing member 14 is a screw, the inner surface of the fastening hole 1322 has screw thread for mating with the fixing member 14 such that the hook-positioning structure 12 and the movable hook 13 can tightly attach together. The fixing member 14 of the present embodiment can be made of metal, and the movable hook 13 can be made of elastic material such as plastic.

As shown in FIG. 7, the interface card 2 can enter from the front support structure 112 to the top of the support-frame bottom portion 111, by the engagement of the curved engagement portions 12121 to the plurality of engagement holes 11153 as shown in FIG. 2. The fixing member 14 can simultaneously pass through the fastening hole 1322 and the vertical-portion slot 1222. By the cooperation of the front support structure 112 and the side support structure 113, the support-retaining structure 1 for interface card of the present disclosure can accommodate interface cards of different dimensions, as shown in FIG. 7, a diagram of practical application of the support-retaining structure for interface card according to the present disclosure.

Figure 8A:
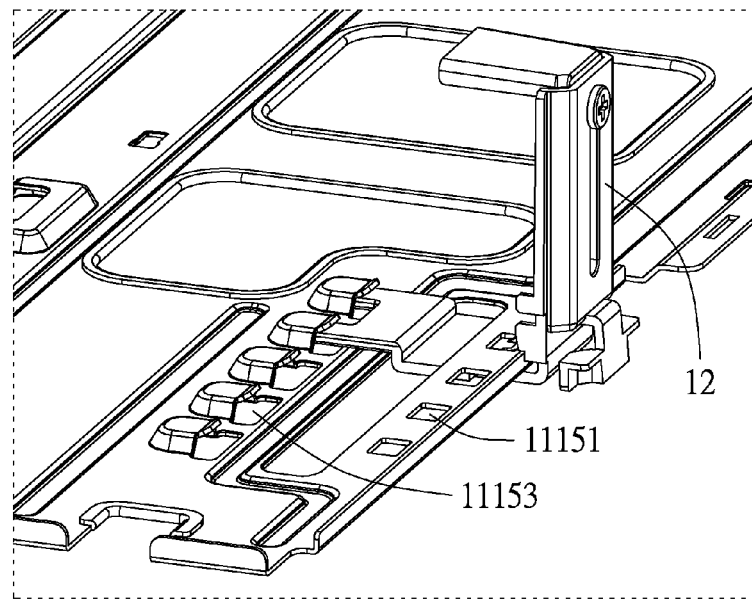
FIG. 8A to FIG. 8D are schematic diagrams of the support-retaining structure for interface card adjusted to retain interface cards of different lengths according to the present disclosure.
Figure 8B:
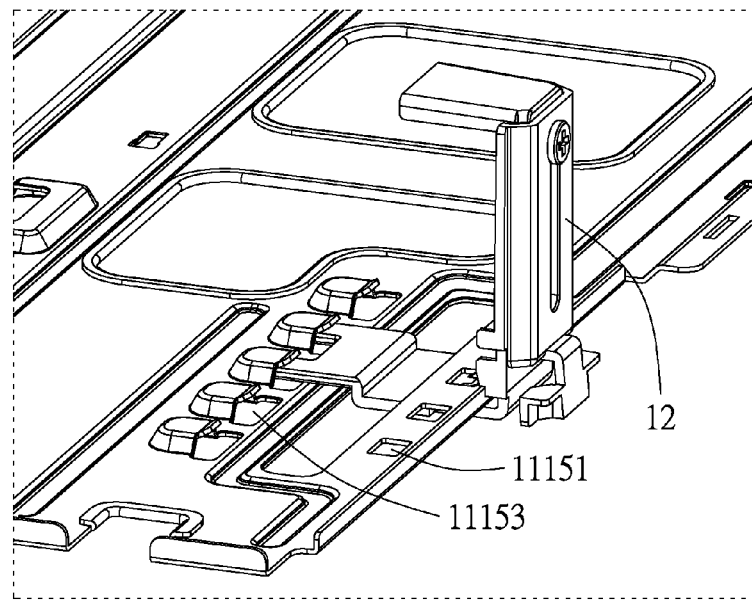
Figure 8C:
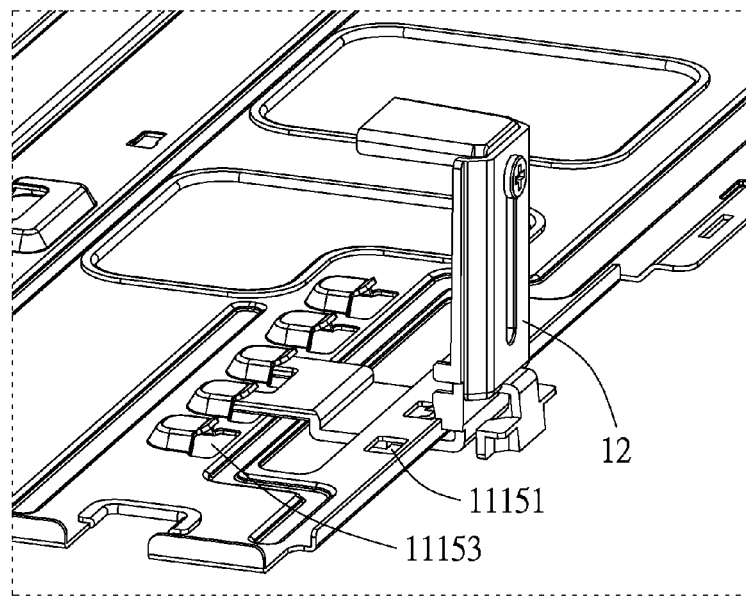
Figure 8D:
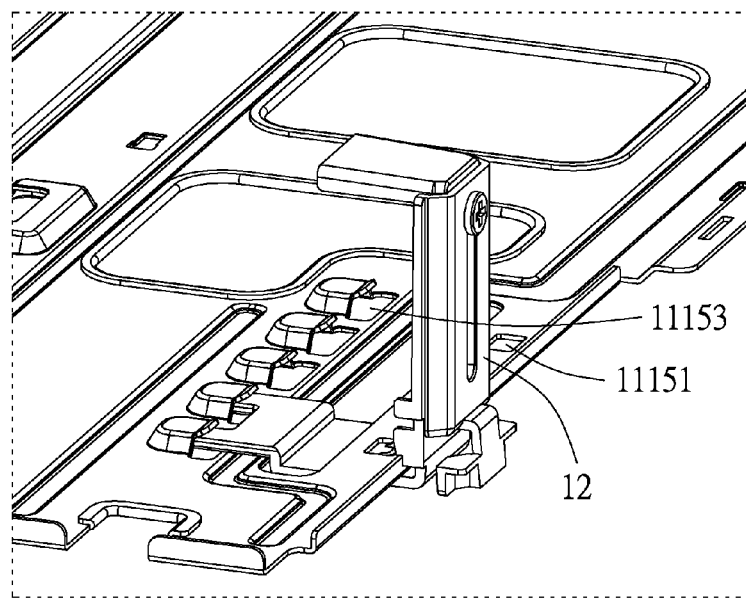

FIG. 8A to FIG. 8D are schematic diagrams of the support-retaining structure for interface card adjusted to retain interface cards of different lengths according to the present disclosure. As shown in FIG. 8A, the engagement holes 11153 and the abutting holes 11151 engaged with the hook-positioning structure 12 are both closer to the front support structure 112, so as to accommodate an interface card with shorter length. Additionally, in FIG. 8B to FIG. 8D, the distances are progressively longer, showing that the present embodiment can accommodate interface cards of different lengths.

FIG. 9A to FIG. 9B are schematic diagrams of the support-retaining structure for interface card adjusted to retain interface cards of different thicknesses according to the present disclosure. As shown in FIG. 9A, the movable hook 13 can be freely fastened on the hook-positioning structure 12 and the distance between the movable hook 13 and the first surface A is a relatively short distance S1 (the distance from the first surface A to the second retaining face 1311b of the retaining portion 131). Additionally, as shown in FIG. 9B, the distance between the movable hook 13 and the first surface A is a relatively longer distance S2 (the distance from the first surface A to the first retaining face 1311a of the retaining portion 131). As such, the present disclosure can accommodate interface cards of different thicknesses.

Figure 10A:
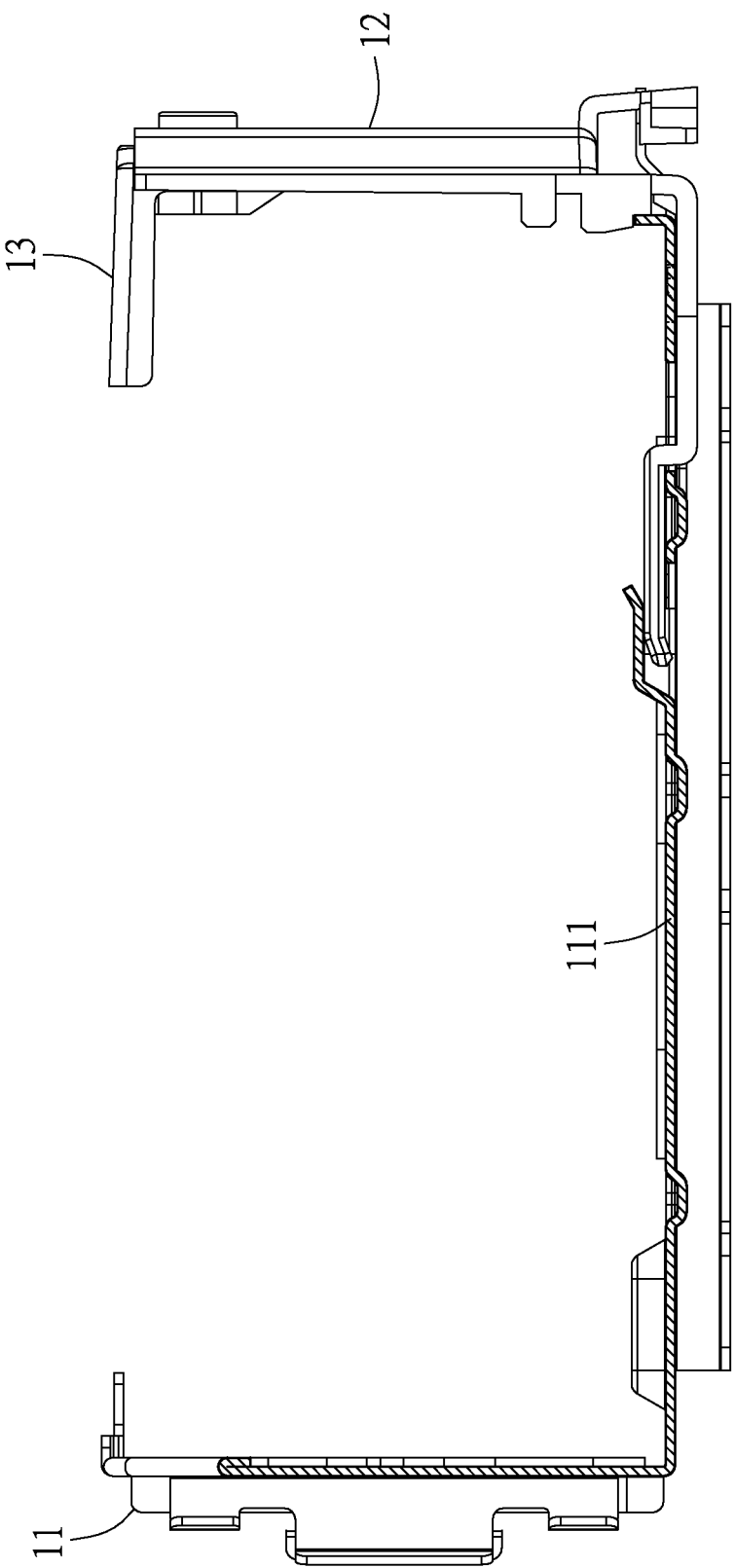
FIG. 10A to FIG. 10C are schematic diagrams showing easy disassembly of a hook-positioning structure of the support-retaining structure for interface card according to a preferred embodiment of the present disclosure.
Figure 10B:
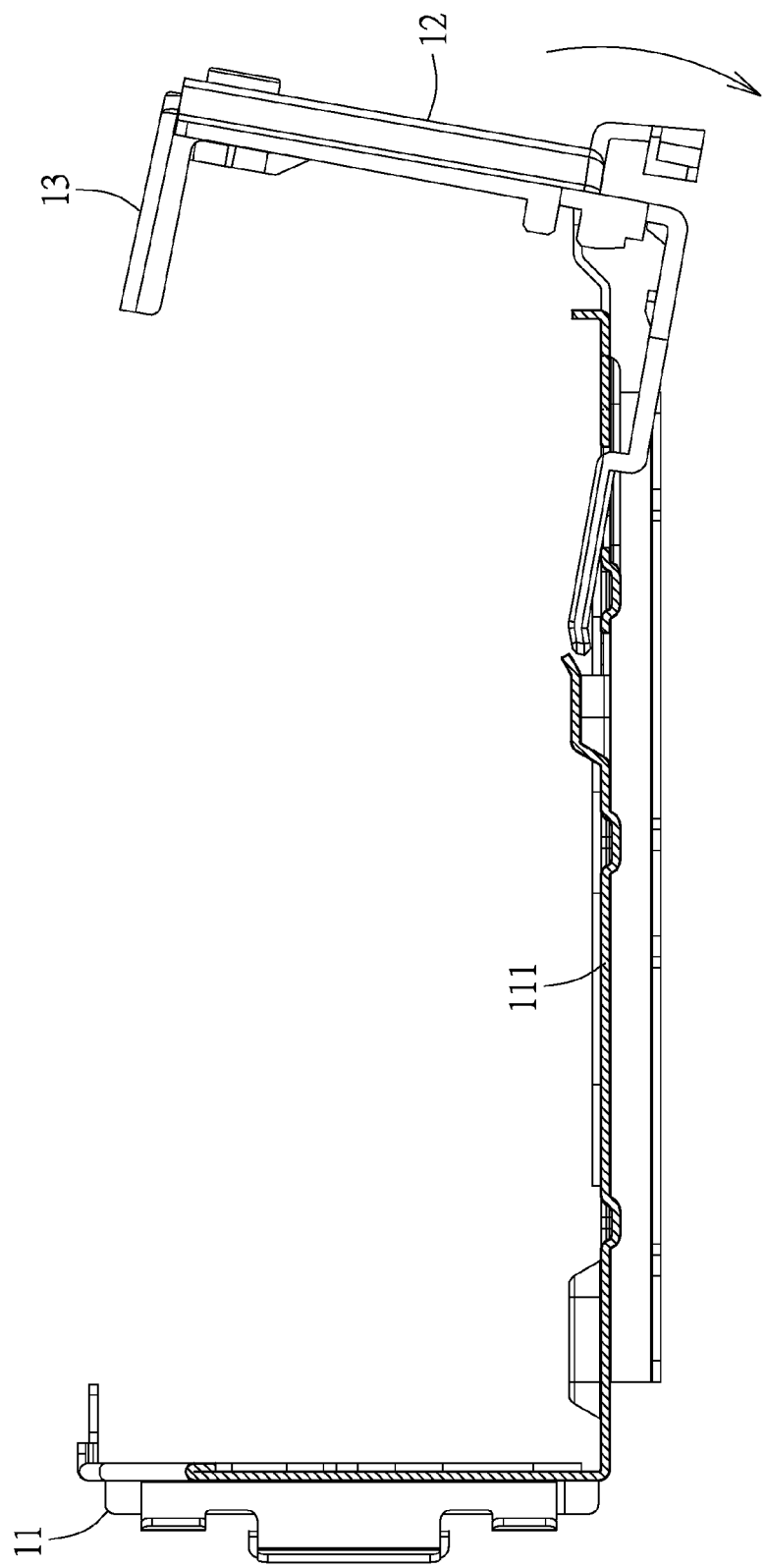
Figure 10C:
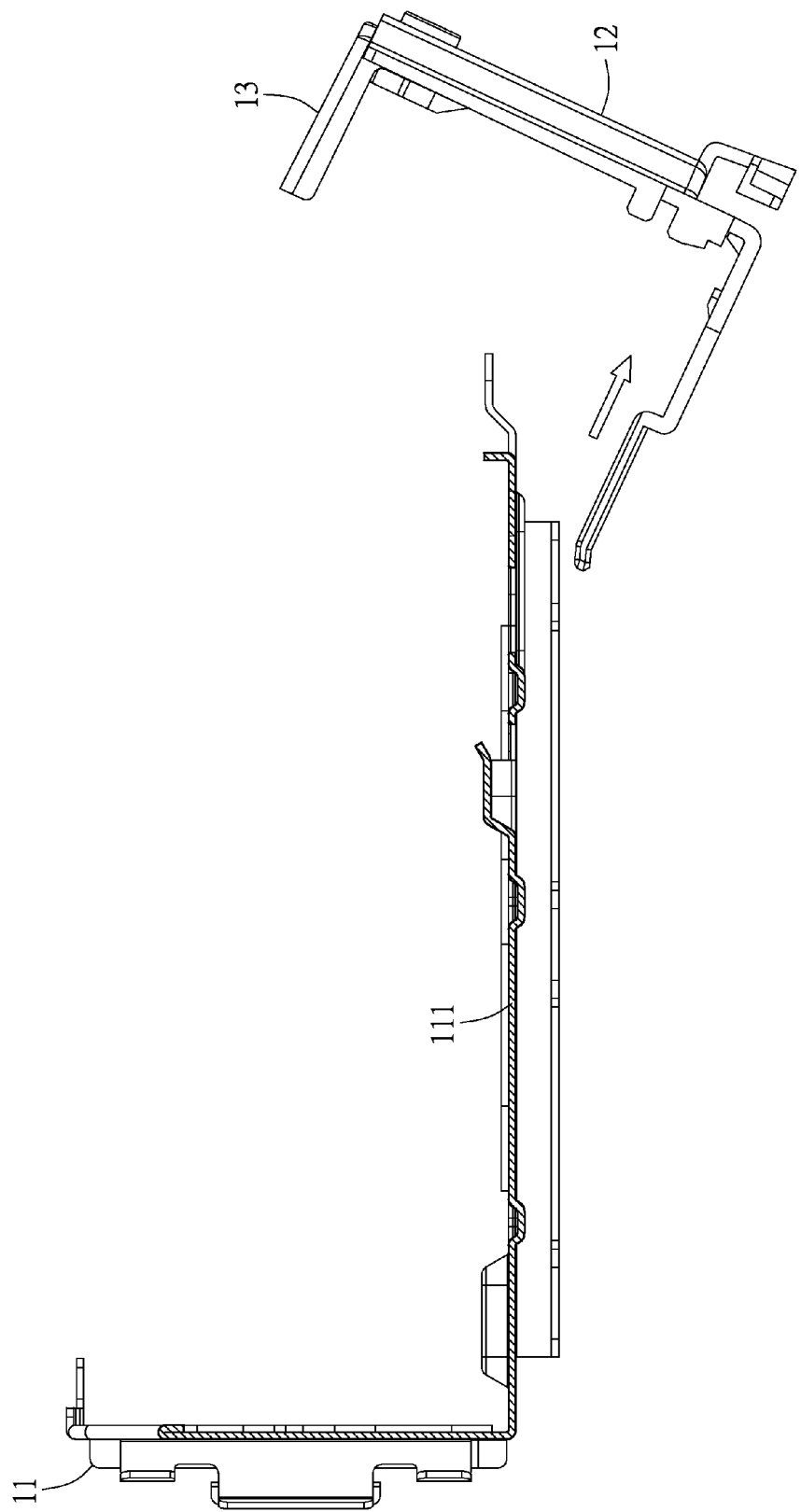

FIG. 10A to FIG. 10C are schematic diagrams showing easy disassembly of a hook-positioning structure of the support-retaining structure for interface card according to a preferred embodiment of the present disclosure. As shown in FIG. 10A, the hook-positioning structure 12 is arranged at a normal position on the support-frame bottom portion 111. Then, as shown in FIG. 10B, since the hook-positioning structure 12 is made of elastic material, the hook-positioning structure 12 can be tilted in the direction of the arrow of FIG. 10B, and then a force can be exerted in the direction of the arrow shown in FIG. 10C to pull out the hook-positioning structure 12.

Figure 11A:
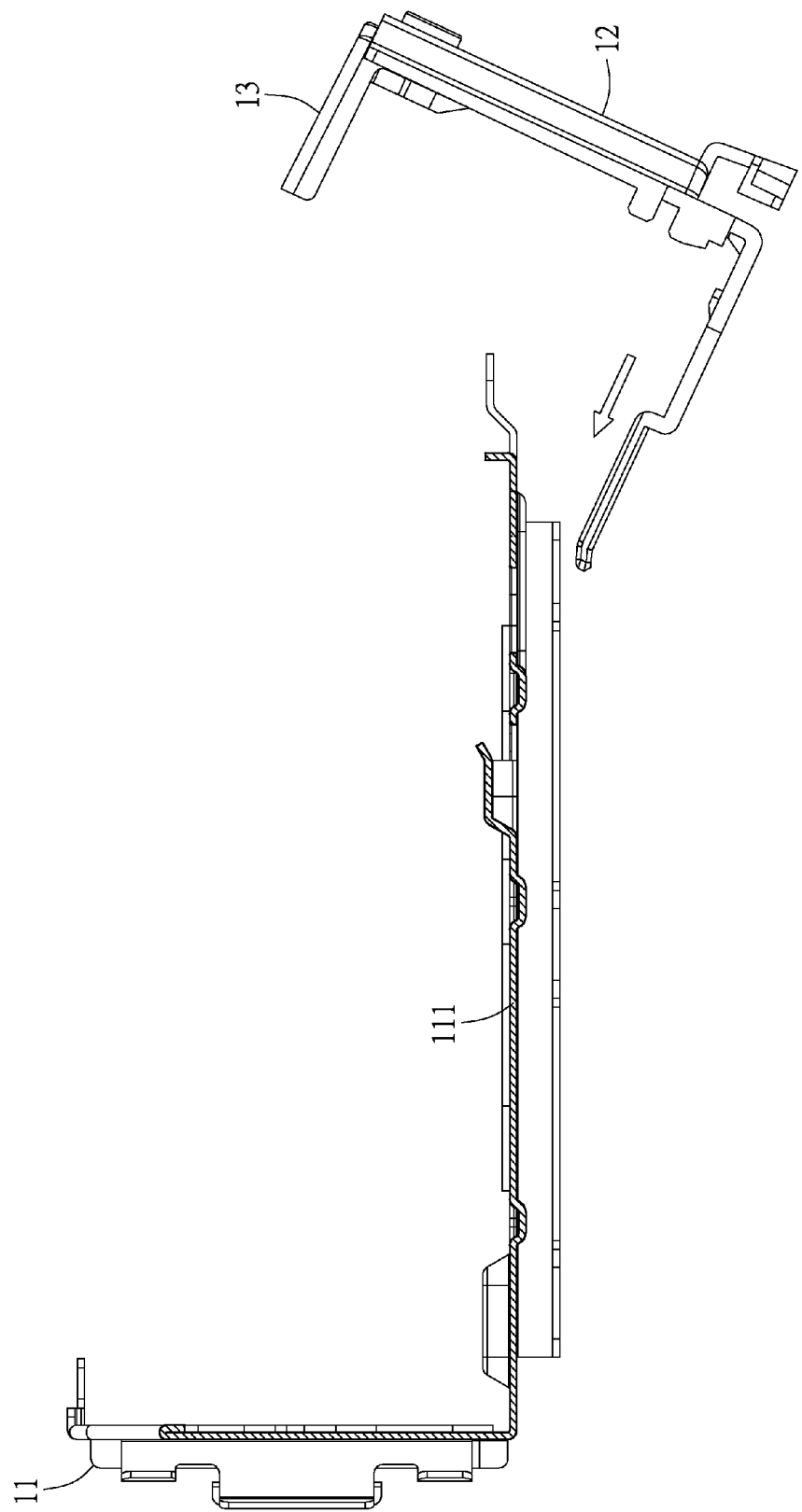
FIG. 11A to FIG. 11C are schematic diagrams showing easy assembly of a hook-positioning structure of the support-retaining structure for interface card according to a preferred embodiment of the present disclosure.
Figure 11B:
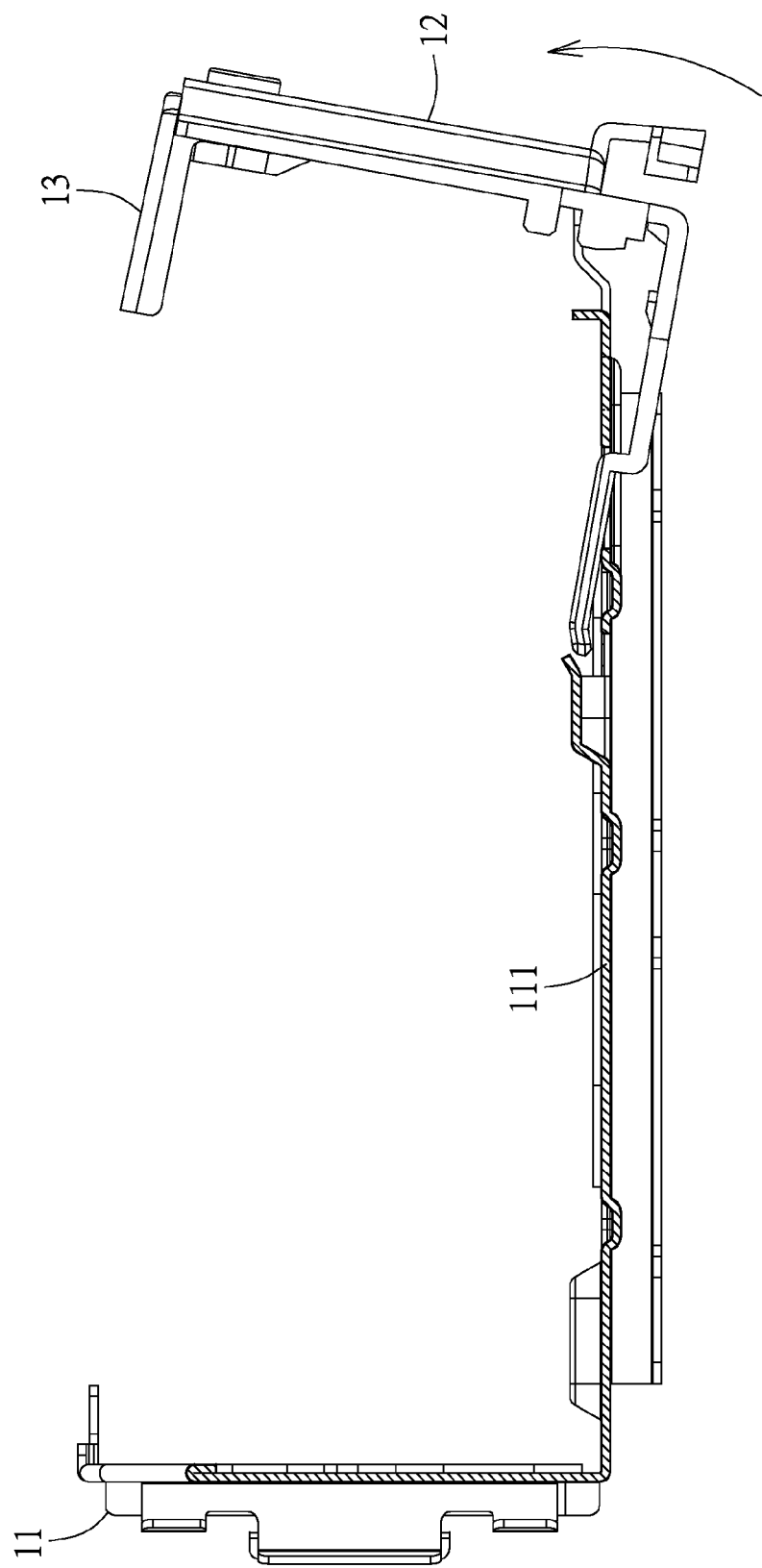
Figure 11C:
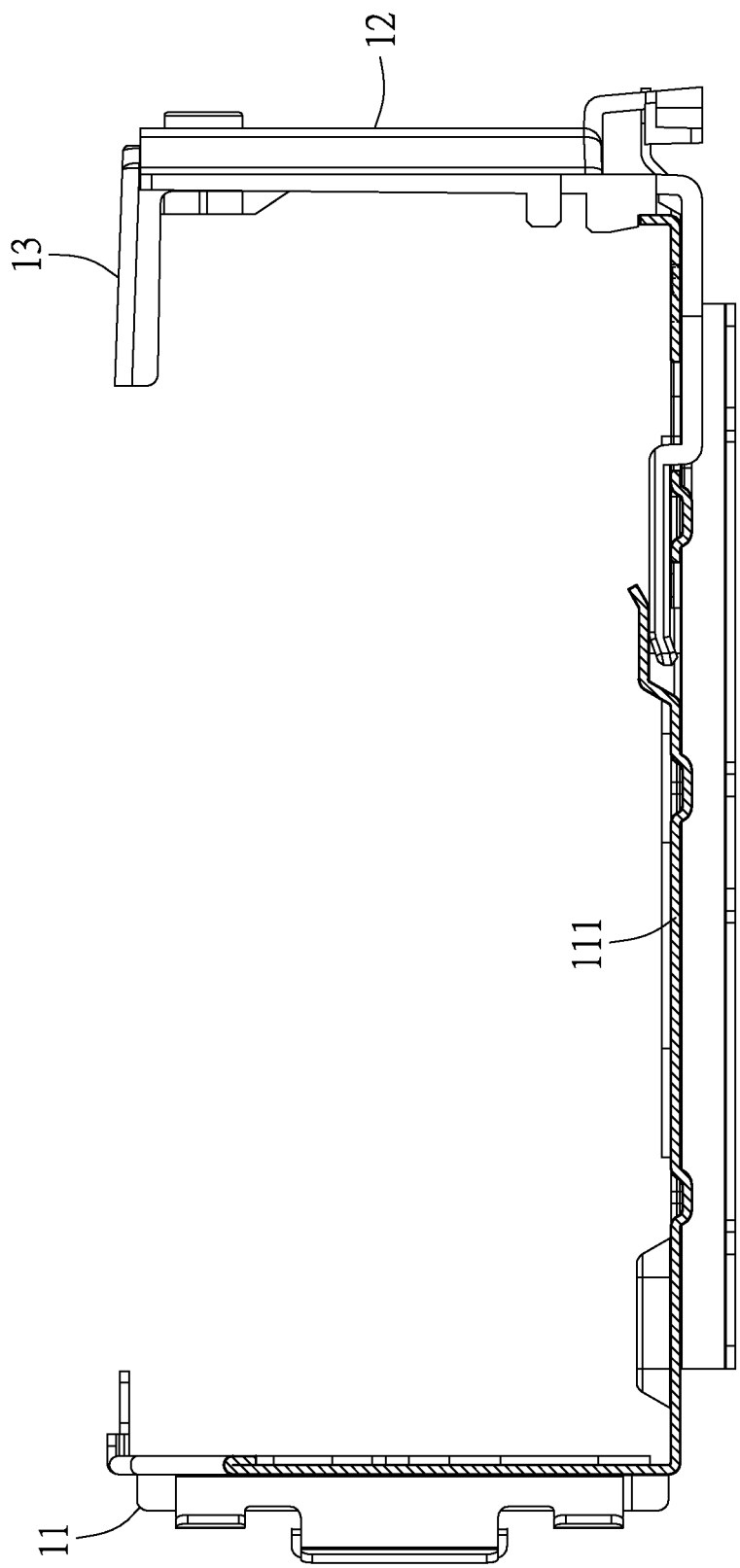

FIG. 11A to FIG. 11C are schematic diagrams showing easy assembly of a hook-positioning structure of the support-retaining structure for interface card according to a preferred embodiment of the present disclosure. As shown in FIG. 11A, a force exerted in the direction of the arrow can provisionally lodge the hook-positioning structure 12 in the support-frame bottom portion 111. Then, a turning force can be applied in the direction of the arrow shown in FIG. 11B to completely attach the hook-positioning structure 12 to the support-frame bottom portion 111 as shown in FIG. 11C.

In summary, the support-retaining structure for interface card of the present disclosure has the following improvements. The curved engagement portions and the abutting portion of the hook-positioning structure provided by the support-retaining structure for interface card cooperate with the engagement holes and the abutting holes of the support frame, such that the present disclosure can accommodate interface cards of different lengths.

The vertical-portion slot of the hook-positioning structure provided by the support-retaining structure for interface card cooperates with the fastening hole of the movable hook and the screw, such that the present disclosure can accommodate interface cards of different thicknesses.

The fitting portion of the vertical portion, and the extension portion and the locking portion of the horizontal portion, of the hook-positioning structure provided by the support-retaining structure for interface card cooperates with the abutting holes and the fixing-structure opening of the fixing structure of the support-frame bottom portion of the support frame to form a loosening-preventive structure for fixing the hook-positioning structure.

The hook-positioning structure provided by the support-retaining structure for interface card is made of elastic material, so it can be tilted, pulled and pushed for easy disassembly and assembly.

The descriptions illustrated supra set forth simply the preferred embodiments of the present disclosure; however, the characteristics of the present disclosure are by no means restricted thereto. All changes, alternations, or modifications conveniently considered by those skilled in the art are deemed to be encompassed within the scope of the present disclosure delineated by the following claims.

What is claimed is:

1. A support-retaining structure for interface card, for fastening an interface card which has at least one connector pin and is mated with an expansion slot of a motherboard, comprising:

a support frame, including:
a support-frame bottom portion, which is planar and includes a first support-frame edge, a second support-frame edge, a third support-frame edge, a fourth support-frame edge and a fixing structure defining a plurality of retaining positions, wherein the first support-frame edge and the third support-frame edge are two corresponding edges, the second support-frame edge and the fourth support-frame edge are two corresponding edges, and each of the fixing structures is disposed proximal to the fourth support-frame edge;
a front support structure, arranged on a first surface of the support-frame bottom portion, standing upright at the first support-frame edge, and having at least one protruding plate secured to a computer casing;
a side support structure, arranged on the first surface of the support-frame bottom portion, standing upright at the second support-frame edge, and formed with at least one through slot for the connector pin of the interface card to pass through;
a hook-positioning structure, having an L-shaped connected structure composed of a horizontal portion and a vertical portion perpendicular to the horizontal portion, wherein the vertical portion is formed with a vertical-portion slot;
a movable hook, having an L-shaped structure composed of a retaining portion and a fastening portion extending perpendicularly from the retaining portion, wherein the retaining portion has a first retaining face and a second retaining face, the fastening portion has a fastening hole selectively corresponding to different positions of the vertical-portion slot; and
a fixing member;
wherein, according to the physical dimensions of the interface card, the hook-positioning structure is retained at one of the retaining positions of the fixing structure, and the movable hook is adjustably fixed at a predetermined position in the vertical-portion slot through passing the fixing member through the fastening hole of the movable hook and the vertical-portion slot of the hook-fastening structure;
wherein the fixing structure is formed with at least one fixing-structure opening and a plurality of engagement holes, the fixing-structure opening is proximal and parallel to the fourth support-frame structure, and the engagement holes are arranged at the side of the fixing-structure opening opposite the fourth support-frame edge and are parallel to the fourth support-frame edge.

2. The support-retaining structure for interface card according to claim 1, wherein the horizontal portion includes an extension portion and a locking portion, the extension portion extends outward from an intersection of the horizontal portion and the vertical portion, then extends in the direction parallel to the vertical portion, the locking portion extends from the extension portion in the direction parallel to the extension portion, at least one curved engagement portion is formed at the free end of the locking portion, and when the hook-positioning structure is connected to the fourth support-frame edge of the support-frame bottom portion, the length of the extension portion of the horizontal portion allows the horizontal portion to cross the face opposite the first surface, and the length between the locking portion and the extension portion allows the locking portion to pass through the fixing-structure opening and lap on the first surface, such that the curved engagement portion engages with the engagement holes.

3. The support-retaining structure for interface card according to claim 2, wherein the fixing structure also has a plurality of abutting holes arranged parallel to the fourth support-frame edge between the fixing-structure opening and the fourth support-frame edge, and the extension portion has at least one abutting portion for engaging with one of the abutting holes when the horizontal portion crosses the face opposite the first surface.

4. The support-retaining structure for interface card according to claim 1, wherein the vertical portion includes at least two fitting portions, the two fitting portions are arranged on two sides of the vertical portion, are perpendicular to the horizontal portion, extend from a corresponding inner face of the vertical portion along the direction parallel to the extending direction of the horizontal portion, and are set apart by a distance from an intersection of the horizontal portion and the vertical portion, the vertical-portion slot is formed at the center of the vertical portion in a long and narrow shape, and when the hook-positioning structure is connected to the fourth support-frame edge, the distance between the two fitting portions and the intersection allows the two fitting portions to lap on the fourth support-frame edge of the first surface.

5. The support-retaining structure for interface card according to claim 1, wherein the fixing structure is a plurality of screw holes.

6. The support-retaining structure for interface card according to claim 1, wherein the two sides of the vertical portion each have a reinforcement wall.

7. The support-retaining structure for interface card according to claim 1, wherein the fixing member is a screw, the inner edge of the fastening hole has a screw thread for coupling with the fixing member, and tightly coupling the fixing member, the hook-positioning structure and the movable hook.

8. The support-retaining structure for interface card according to claim 1, wherein when the movable hook is fixed at a predetermined position on the vertical-portion slot, the first surface of the support-frame bottom portion and the first retaining face are two corresponding faces spaced apart with a predetermined distance there-between.

9. The support-retaining structure for interface card according to claim 1, wherein when the movable hook is fixed at a predetermined position on the vertical-portion slot, the first surface of the support-frame bottom portion and the second retaining face are two corresponding faces spaced apart with a predetermined distance there-between.

* * * * *